(12) United States Patent
Huang

(10) Patent No.: US 6,555,292 B1
(45) Date of Patent: Apr. 29, 2003

(54) LIQUID PHOTOPOLYMER USEFUL IN FABRICATING PRINTING PLATES WHICH ARE RESISTANT TO SOLVENT BASED INK

(76) Inventor: Misty Huang, 712 Cheltenham Rd., Wilmington, DE (US) 19808

( * ) Notice: Subject to any disclaimer, the term of this patent is extended or adjusted under 35 U.S.C. 154(b) by 921 days.

(21) Appl. No.: 08/719,968

(22) Filed: Sep. 24, 1996

(51) Int. Cl.$^7$ ............................. G03F 7/038; G03F 7/30
(52) U.S. Cl. ..................... 430/306; 430/300; 430/284.1
(58) Field of Search ................................ 430/300, 306

(56) References Cited

U.S. PATENT DOCUMENTS

| | | | | |
|---|---|---|---|---|
| 3,764,324 A | * | 10/1973 | Reyes | 430/306 X |
| 3,960,572 A | * | 6/1976 | Ibata et al. | 96/115 P |
| 4,198,238 A | * | 4/1980 | Scheve | 430/306 X |
| 4,423,135 A | * | 12/1983 | Chen et al. | 430/306 X |
| 4,925,775 A | * | 5/1990 | Hoffmann | 430/306 |

FOREIGN PATENT DOCUMENTS

| | | | | |
|---|---|---|---|---|
| EP | 470834 A | * | 2/1992 | 430/306 |
| JP | 5-216225 | * | 8/1993 | 430/300 |

OTHER PUBLICATIONS

Van Norstrand Reinhold "Hawley's Condensed Chemical Dictionary" pp. 932–935, STIC, PTO Mar. 28, 1991.*
Robert Thornton Morrison, Robert Neilson Boyd (NY Univ.) Third Ed. Allyn and Bacon, Inc. Boston p. 1048 Chap 32.*

* cited by examiner

Primary Examiner—Cynthia Hamilton

(57) ABSTRACT

A polymer based on the reaction of an excess of diisocyanate with saturated polyolefine diols to form an oligomer and further reaction of the oligomer with hydroxyacrylates or hydroxymethacrylates is discussed. The polymer is then blended with ethylenically unsaturated monomers and a photoinitiator to produce a photosensitive composition which is useful in fabricating printing plates.

5 Claims, No Drawings

LIQUID PHOTOPOLYMER USEFUL IN FABRICATING PRINTING PLATES WHICH ARE RESISTANT TO SOLVENT BASED INK

BACKGROUND OF THE INVENTION

This invention relates to liquid polymer compositions which are useful in the manufacture of imaged printing plates and coatings through photopolymerization. Photocurable compositions useful in forming printing plates and coatings, in general, are well known in the art. In particular U.S. Pat. No. 2,760,863 (Plambeck) describes the use of certain photopolymers in the fabrication of printing plates. However, the processes of Plambeck require the use of relatively toxic solvents to develop away the unpolymerized photopolymer thereby revealing the relief image of the printing plate.

U.S. Pat. Nos. 3,960,572; 4,137,081; 4,442,302; and 4,857,434, the teaching each of which are included herein by reference in their entirety, reveal certain improvements to the processes of Plambeck. One of the most notable improvements of the foregoing disclosures is that the photopolymers utilized can be developed, after selective polymerization with light, in aqueous based solutions. Aqueous developable photopolymers of the foregoing type are currently marketed under the Merigraph trade name by MacDermid Imaging Technology, Inc. of Wilmington, Del. These aqueous developable photopolymers are useful in printing a variety of substrates including paper, cardboard and plastic, due to the fact that they are capable of forming printing plates having the necessary hardness, flexibility, resilience, and abrasion resistance required for such printing.

The liquid photopolymers currently known and utilized are useful in printing with aqueous or alcohol based inks only. They are not useful in printing with organic solvent ("solvent") based inks because the cured polymers do not possess the necessary resistance to solvents. When exposed to solvent based inks cured liquid photopolymers generally degrade or swell to an unacceptable degree, making their usefulness in printing these solvent based inks much less than desirable.

In a variety of applications, such as film printing, it is necessary or desirable to print with solvent based inks. The solvents used in such inks may be one or a mixture of commonly used organic solvents, such as petroleum distillates. In any case, liquid photopolymers, such as those described above, have not possessed the necessary resistance to these solvents and thus are not useful in fabricating printing plates for these applications.

It is therefore an object of this invention to reveal liquid photopolymer compositions which produce printing plates which are resistant to a variety of inks, including water based, alcohol based and solvent based. The printing plates produced using the compositions of this invention are therefore useful in a wide variety of printing applications.

It is a further object of this invention to reveal liquid photopolymer compositions which produce printing plates having the hardness, flexibility and abrasion resistance which is necessary for printing in a variety of applications. Thus the photopolymer compositions of this invention are capable of producing high quality artwork using a wide variety of inks and on various types of surfaces.

SUMMARY OF INVENTION

These and other objects are achievable with a photopolymer composition comprising:

A. An ethyleneically unsaturated polyurethane prepolymer having the structure:

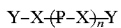

Wherein P is selected from the group consisting of hydrogenated polybutadiene, hydrogenated polyisoprene and copolymers of hydrogenated butadiene with styrene (note that the starting raw reactants for P is a hydroxyl terminated compound selected from the previously noted group);
Wherein X is selected from the group consisting of aromatic diisocyanates and aliphatic diisocyanates;
Wherein Y is a terminal group which has an ethyleneically active portion at the outer end of the group; and
Wherein n is an integer from 1 to 20;

B. at least one ethylenically unsaturated monomer; and
C. at least one photoinitiator.

DETAILED DESCRIPTION OF THE INVENTION

The liquid photopolymer compositions of the present invention are useful in preparing printing plates which have good resistance to solvent based inks as well as the requisite hardness, flexibility and resilience for effective, high quality printing on a variety of substrates. The photosensitive resins of the present invention provide photopolymer printing plates which have a shore A hardness between 30 and 70 on the shore A scale at 20° C. and a solvent swell (a typical measure of solvent resistance) of 8–10 wt. % or lower in a solution of 15% by weight n-propyl acetate (a common ink solvent) and 85% isopropanol for 24 hours. Properties in these ranges render said plates useful for printing on plastic film, as well as other types of substrates, in a flexographic printing process. The plates produced are also capable of effectively printing with water, alcohol or solvent based printing inks.

The liquid photopolymer composition of the current invention comprises:
A). at least one ethylenically unsaturated polyurethane prepolymer;
B). at least one photoinitiator;
C). at least one ethylenically unsaturated monomer.

The polyurethane prepolymer of the current invention is prepared by reacting an excess of a diisocyanate with a saturated polyolefine diol, such as hydrogenated polybutadiene diol, or with a mixture of said saturated polyolefine diols and unsaturated diols, or with a mixture of said saturated polyolefine diols and short chain diols such as butane diol, hexane diol, propyl ethyl propane diol and trimethyl pentane diol, or with a mixture of said saturated polyolefine diols and polyester diols, such as polyhexylene adipate. The foregoing reaction of the saturated polyolefine diol, or the indicated mixtures containing said saturated polyolefine diol, with an excess of diisocyanate will form an isocyanate terminated polyurethane oligomer. Other ingredients, such as the ethylenically unsaturated monomer(s), acetic acid or solvents, may be added to the reactant mixture to adjust the viscosity thereof The diisocyanate used can be aromatic or aliphatic diisocyanates, but aromatic diisocyanates are preferred. Suitable aliphatic diisocyanates include trimethyl hexamethylene diisocyanate and biscyclohexylmethylene diisocyanate. Preferred aromatic diisocyanates include toluene diisocyanate and methylene diphenyl diisocyanate.

The oligomer is then further reacted with a hydroxyacrylate, hydroxy methacrylate or mixtures thereof to form the ethylenically unsaturated polyurethane prepolymer. Suitable hydroxy acrylates or methacrylates include: hydroxypropyl methacrylate, polypropylene glycol monomethacrylate, and acrylated caprolactone oligomers. Polypropylene glycol monomethacrylate, hydroxypropyl methacrylate, or a mixture of the foregoing are preferred.

The ethyleneically unsaturated polyurethane prepolymer formed by the foregoing reactions can be described by the following:

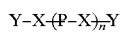

Wherein P is a saturated polyolefine, preferably a hydrogenated material selected from the group consisting of hydrogenated polybutadienes, hydrogenated polyisoprenes and copolymers of hydrogenated butadiene with styrene (note that the starting raw reactants for P are hydroxy terminated hydrogenated polybutadienes, hydroxy terminated hydrogenated polyisoprenes, and hydroxy terminated copolymers of hydrogenated butadiene with styrene);

Wherein X is selected from the group consisting of aromatic diisocyanates and aliphatic diisocyanates;

Wherein Y is a terminal group which has an ethylenically active portion at the outer end of the group. Preferably said terminal group is an acrylate, a methacrylate, of mixtures thereof (note that the raw reactants are hydroxy acrylates or hydroxy methacrylates) most preferably polypropylene glycol monomethacrylate; and wherein n is a integer of from 1 to 20.

The use of a mixture of the saturated polyolefine diol(s) with the short chain diols or the polyester diols in the foregoing reaction improves the mechanical properties of the resultant photopolymer printing plates. However, the polarity of the short chain diols (molecular weight below 500) or the polyester diols also reduces the solvent resistance of the resulting printing plate. It is therefore preferred to use no more than 30% by weight of short chain diols and/or polyester More preferably, the amount of short chain diol or polyester diol is less than 15% by weight as noted above.

In order to produce an ethylenically unsaturated polyurethane prepolymer having the appropriate viscosity for manufacturing of flexographic printing plates, and to produce printing plates having the appropriate hardness, tensile strength and elongation, it is preferred to begin with saturated polyolefine diols having a molecular weight from 500 to 5,000, more preferably between 2,000 and 4,500 and most preferably greater than 3,000.

In addition to the ethylenically unsaturated polyurethane prepolymer, the photopolymer resins of the current invention also comprise at least one ethylenically unsaturated monomer and at least one photoinitiator. The ethylenically unsaturated monomer may be any commonly available acrylate or methacrylate such as isobornylester, t-butylester, laurylester, monoesters or diesters of acrylic acid or methacrylic acid, and/or triesters of trimethylopropanol or propoxylated trimethylolpropanol. However, the use of a monomer having two or more ethylenically unsaturated groups in the monomer increases the hardness of the resultant printing plate. Thus the amount of monomers with two or more ethylenically unsaturated groups in the monomer increases the hardness of the resultant printing plate. Therefore the amount of monomers with two or more ethylenically unsaturated groups should be controlled such that a printing plate with the desired hardness is the result.

It is preferred that the ethylenically unsaturated monomer comprise a mixture of monomers with some having one ethylenically unsaturated group and some having two or more ethylenically unsaturated groups. The optimum ratio of the mixture will be determined by the desired hardness of the resulting printing plate. The amount of the monomer or monomer mixture will have an effect on the viscosity of the photosensitive resin. The greater the amount of the monomer or monomer mixture, the lower the resultant viscosity of the photosensitive resin. The viscosity of the photosensitive resin is preferably between 10,000 cps and 200,000 cps at room temperature and more preferably between 50,000 cps and 150,000 cps.

Any commonly used photopolymerization initiator customarily used in similar photosensitive resin compositions will be suitable. Specifically, ethers, such as benzoin ether and/or acetophenone and its derivatives are commonly used as photopolymerization initiators. One particularly preferred initiator is 2,2-dimethoxy-2-phenylacetophenone. The amount of the initiator can be any effective concentration which will allow the formation of a base layer to the flexographic printing plate via a back exposure of a reasonable length of time, and the formation of a relief image with the required resolution. The effective amount of photopolymerization initiator will depend upon the initiator chosen and the desired thickness of the resultant printing plate. For 2,2-dimethoxy-2-phenylacetophenone, an effective concentration is between 0.1% and 1.5% by weight in the photopolymer resin, most preferably between 0.3% and 1.0% by weight.

In addition to all of the above the photosensitive resin compositions of the current invention may also, optionally, comprise slip additives, dyes, stabilizers and other additives of a similar nature which are typically added to photosensitive resin compositions.

The following examples are given as illustrative of the current invention but should not be taken as limiting:

EXAMPLE 1

To a mixture of 200 parts by weight of a hydrogenated polybutadiene (1.94 terminal hydroxyl groups per molecule and an average molecular weight of 3630), 40 parts of isobornyl methacrylate, 0.5 parts of acetic acid and 0.6 part of t-butyl hydroxy toluene (BHT) was added 14 parts of by weight of 2,4-toluene diisocyanate (TDI) (the isobornyl methacrylate, acetic acid and t-butyl hydroxy toluene are added at this point for viscosity adjustment of the reactant mixture). The resulting mixture was reacted at 50C for 2.5 hours to obtain a polyurethane oligomer having isocyanate groups at both ends of the molecule. To this were added 12 parts by weight of hydroxypropyl methacrylate and 20 ppm of dibutyl tin dilaurate (DBTDL) after which the reaction mixture was stirred at 70C until no residual isocyanate could be determined by titration with di-n-butylamine.

To 83 grams of the foregoing prepolymer were added 14 grams of isobornyl methacrylate and 0.5 grams of trimethylolpropane trimethacrylate (TMPTMA) and 0.5 grams of 2,2-dimethyloxy-2-phenylacetylphenone (DMPAP). And the resulting mixture was mixed for 2 hours to obtain a photosensitive resin composition.

A 40 mil thick plate was radiated between a 60 gauge propylene film and 7 mil polyethylene (PET) film at 8 mW/cm$^2$ for 6.5 minutes. The cured material had tensile strength of 2162 psi, elongation of 353%, and Shore A 82 and resilience of 21%. Solvent swell of the sample in a mixed solution (15% isopropyl acetate (IPAc) and 85% isopropyl alcohol) for 24 hours was 7.4%.

EXAMPLE 2

200 parts by weight of hydrogenated polybutadiene with 1.95 terminal hydroxyl groups per molecule and number average molecular weight of 3190 were reacted with 16.5 parts of trimethyl hexamethylene diisocyanate at 40 C for 2 hours. 27.5 parts of hydroxy polyester acrylate (Mw~344) were then added. The reaction mixture was stirred at 40 C until no residual isocyanate could be determined.

To 73 grams of the foregoing prepolymer were added 26 grams of isobornyl methacrylate and 0.25 grams of trimethylolpropane trimethacrylate, 0.3 gram of 2,2-dimethyloxy-2-phenyl acetylphenone and 0.3 gram of benzoin isobutyl ether. Then the resulting mixture was mixed for 2 hours to obtain a photosensitive resin composition. After exposure the plate had tensile strength of 1172, elongation of 476%, Shore A of 66, and resilience of 23%. Solvent swell of the sample after 24 hours was 9% by weight.

EXAMPLE 3

To a mixture of 200 parts of hydrogenated polybutadiene having 1.9 terminal hydroxyl groups per molecule and average molecular weight of 3350, 20 parts by weight of isobornyl methacrylate, 0.6 part of t-butyl hydroxy toluene and 0.5 part of acetic acid, was added 21.27 parts by weight of 4, 4'-diphenylmethane diisocyanate. The resulting mixture was reacted at 60 C for 1.5 hours to obtain an isocyanate terminated oligomer. To this was added 11.5 parts of hydroxypropyl methacrylate, 13 parts of polypropylene glycol monomethacrylate and 20 ppm of dibutyl tin dilaurate. The reaction mixture was stirred at 70 C until no residual isocyanate could be determined.

To 71 grams of the foregoing prepolymer were added 11.3 grams of isobornyl methacrylate, 0.24 grams of trimethylol propane trimethacrylate and 0.47 gram of 2,2 dimethyloxy-2-phenyl acetylphenone, and the mixture was agitated for 2 hours to obtain a photosensitive resin blend. After exposure, the plate had tensile strength 1314 psi, elongation 344%, Shore A of 60, and resilience 17%. Solvent swell of the sample after 24 hours was 8.5% by weight.

EXAMPLE 4

To a mixture of 100 parts by weight of hydrogenated polybutadiene having molecular weight of 3400 with 1.94 hydroxyl terminal groups per molecule, 10 parts by weight of lauric methacrylate, 0.3 part of t-butyl hydroxytoluene and 0.25 part of acetic acid was added 6.45 parts of 2,4-toluene diisocyanate. The reaction was held at 65 C for 1.5 hours to obtain a polyurethane oligomer having isocyanate groups at both ends of the molecule. Then 15 parts by weight of polypropylene glycol monomethacrylate, 10 parts of isodecyl methacrylate and 20 ppm of dibutyl tin dilaurate were added. The reaction mixture was stirred at 70 C until no residual isocyanate could be determined.

To 71 grams of the foregoing prepolymer were added 15 grams of propoxylated phenol methacrylate, 5 grams of 2-phenoxyethyl methacrylate, 0.5 gram of trimethylol propane trimethacrylate and 1.3 gram of 2,2 dimethyloxy-2-phenyl acetylphenone. The mixture was stirred for 2 hours to obtain a photosensitive resin blend. After exposure, the plate had tensile strength 450 psi, elongation 320%, Shore A of 36, and resilience 28%. Solvent swell of the sample was 10.7% by weight.

EXAMPLE 5

To a mixture of 200 parts by weight of hydrogenated polybutadiene having molecular weight of 3400 with 1.94 hydroxyl terminal group per molecule, 10 parts by weight of polyester diol with molecular weight of 1700, 20 parts of isobornyl methacrylate, 0.6 part of t-butyl hydroxy toluene and 0.5 part of acetic acid was added 14.5 parts of 2,4 toluene diisocyanate. The reaction was held at 65 C for 1.5 hours to obtain a polyurethane oligomer having isocyanate group at both ends of the molecule. Then 6.6 parts of hydroxypropyl methacrylate, 21.4 parts of polypropylene glycol monomethacrylate, 20 parts of isobornyl methacrylate, and 20 ppm of dibutyl tin dilaurate were added and reacted at 70 C until no residual isocyanate could be determined.

To 71 grams of the foregoing prepolymer were added 4.9 grams of isobornyl methacrylate, 10 grams of ethoxylated phenol methacrylate, 3 grams of hexanediol dimethacrylate, 0.8 grams of trimethylol propane trimethacrylate and 0.48 grams of 2,2 dimethyloxy-2-phenyl acctylphenone. The mixture was stirred for 2 hours to obtain a photosensitive resin blend. After exposure, the plate had tensile strength 1560 psi, elongation 210%, Shore A of 55, and resilience of 22%. Solvent swell of the sample was 11.9%.

EXAMPLE 6

To a mixture of 200 parts by weight of hydrogenated polybutadiene having molecular weight of 3400 with 1.94 hydroxyl terminal group per molecule, 13.4 parts of hexanediol, 0.6 part of t-butyl hydroxy toluene and 0.5 part of acetic acid was added 35.6 parts of 2,4-toluene diisocyanate. The reaction was held at 60 C with presence of 20 ppm of dibutyl tin dilaurate for 6 hours to obtain a polyurethane oligomer having isocyanate groups at both ends of the molecule. 6.6 parts of hydroxy propylmethacrylate, 21.4 parts of polypropylene glycol monomethacrylate and 10 ppm of dibutyl tin dilaurate were then added and reacted at 70 C until no residual isocyanate could be determined.

To 71 grams of the prepolymer were added 25 grams of isobornyl methacrylate, 0.25 grams of tri methylol propane trimethacrylate and 0.48 gram of 2,2 dimethyloxy-2-phenyl acetylphenone. The resin blend was stirred for 2 hours. After exposure, the plate had 2260 psi in tensile strength, 356% in elongation, a Shore A of 81, and 20% in resilience. Solvent swell of the sample after 24 hours was 7.3% by weight.

COMPARATIVE EXAMPLE

To a mixture of 553 parts of carboxylic terminated polybutadiene having molecular weight of 5500, 5.5 parts of phosphited polyalkyl polyphenol, 3.3 parts of t-butyl hydroxy toluene, and 2.76 parts of triphenylphosphine was added 21.6 parts of neopentyl glycol diglycidyl ether. The mixture was stirred at 95 C for about 6 hours to obtain a oligomer with carboxylic termination. 21.3 parts by weight of glycidyl methacrylate was then added and reacted at 100 C until the acid number is less than 1 determined by titration.

To 73 grams of the foregoing prepolymer were added 25 grams of isobornyl methacrylate, 0.25 grams of trimethylol propane trimethacrylate, 0.48 grams of 2,2 dimethyloxy-2-phenyl acetylphenone. The mixture was stirred for 2 hours to obtain a photosensitive resin blend. After exposure the plate had 1100 psi tensile strength, 350% in elongation, Shore A of 45 and 14% in resilience. Solvent swell of the sample after 24 hours was 17% by weight.

What is claimed is:

1. A process for fabricating a printing plate, said process comprising:

a). selectively exposing a photosensitive resin composition consisting essentially of:

1). an ethylenically unsaturated polyurethane prepolymer which is the reaction product of X, Y and P and which prepolymer has the following structure:

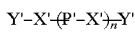

wherein P is selected from the group consisting of hydrogenated polybutadiene diols, hydrogenated polyisoprene diols, copolymer diols of hydrogenated butadiene with styrene, mixtures of any of the foregoing diols, and mixtures of any of the foregoing diols with a compound selected from the group consisting of unsaturated polyolefin diols, short chain diols, and mixtures of any of the foregoing; wherein X is independently selected from the group consisting of aromatic diisocyanates, aliphatic diisocyanates and mixtures of the foregoing; wherein Y is selected from the group consisting of acrylates, methacrylates and mixtures of the foregoing;

wherein n is an integer of from 1 to 20;

wherein P', X' and Y' are the reaction residues of P, X and Y;

2). at least one ethylenically unsaturated monomer; and

3). at least one photopolymerization initiator;

to actinic radiation; and b). developing away any unpolymerized photosensitive resin.

2. A process according to claim 1 wherein Y is polypropylene glycol monomethacrylate.

3. A process according to claim 1 wherein the prepolymer has a molecular weight greater than 3,000.

4. A process according to claim 1 wherein the monomer comprises is a mixture of monomers having one ethylenic group and monomers having more than one ethylenic group.

5. A process for fabricating a printing plate, said process comprising:

a). selectively exposing a photosensitive resin composition comprising:

1). an ethylenically unsaturated polyurethane prepolymer which prepolymer is formed by: (a) reacting an excess of a diisocyanate with diols, which diols are selected from the group consisting of hydrogenated polybutadiene diols, hydrogenated polyisoprene diols, copolymer diols of hydrogenated butadiene with styrene, mixtures of any of the foregoing diols, and mixtures of any of the foregoing diols with a compound selected from the group consisting of unsaturated polyolefin diols, short chain diols, and mixtures of any of the foregoing, to form an oligomer, and (b) further reacting the oligomer with a compound selected from the group consisting of hydroxyacrylates, hydroxymethacrylates and mixtures of the foregoing;

2). at least one ethylenically unsaturated monomer; and

3). at least one photopolymerization initiator; to actinic radiation; and b). developing away any unpolymerized photosensitive resin.

* * * * *

UNITED STATES PATENT AND TRADEMARK OFFICE
CERTIFICATE OF CORRECTION

PATENT NO.    : 6,555,292 B1                                         Page 1 of 1
DATED         : April 29, 2003
INVENTOR(S)   : Misty Haung It is certified that error appears in the above-identified patent and that said Letters Patent is hereby corrected as shown below:

<u>Column 8,</u>
Line 2, delete the word "is" between the words "comprises" and "a mixture"

Signed and Sealed this

Twenty-sixth Day of August, 2003

*JAMES E. ROGAN*
*Director of the United States Patent and Trademark Office*